(12) United States Patent
Babb et al.

(10) Patent No.: US 6,980,589 B1
(45) Date of Patent: Dec. 27, 2005

(54) CARRIER FREQUENCY COMPENSATION SYSTEM AND METHOD

(75) Inventors: Roger A. Babb, Orlando, FL (US); Kevin J. Krizman, Orlando, FL (US)

(73) Assignee: Carriercomm, Inc., Santa Barbara, CA (US)

( * ) Notice: Subject to any disclaimer, the term of this patent is extended or adjusted under 35 U.S.C. 154(b) by 0 days.

(21) Appl. No.: 09/442,853

(22) Filed: Nov. 18, 1999

(51) Int. Cl.[7] .............................. H04B 1/38; H04L 5/16
(52) U.S. Cl. ........................ 375/222; 375/295; 375/316
(58) Field of Search ........................ 375/222, 295–352; 332/100, 127; 455/14, 127, 41, 126, 161.2, 455/567

(56) References Cited

U.S. PATENT DOCUMENTS

| | | | |
|---|---|---|---|
| 5,465,402 A * | 11/1995 | Ono et al. ................ | 455/161.2 |
| 5,574,995 A * | 11/1996 | Masaki ..................... | 455/161.2 |
| 5,732,333 A * | 3/1998 | Cox et al. ................... | 455/126 |
| 6,366,622 B1 * | 4/2002 | Brown et al. .............. | 375/322 |

* cited by examiner

Primary Examiner—Stephen Chin
Assistant Examiner—Curtis Odom
(74) Attorney, Agent, or Firm—Fulbright & Jaworski LLP

(57) ABSTRACT

Systems and methods automatically compensate for long-term drift of frequency standards or references used by transmitting and receiver terminals to avoid manual adjustment of the terminals to bring them back within operating tolerances and minimize communications outages caused by inability of the system to otherwise accommodate for such drift. The present invention may provide automatic band selection to maintain a modulated carrier within an operating range of an automatic frequency control or tracking capability of a communication device. This may be accomplished by selecting an appropriate reference signal used to control a center frequency of an automatic frequency control circuit (such as a PLL) or used to convert the carrier frequency of the modulated carrier to fall within the operating range of the automatic frequency control circuit and/or by causing the transmitting station to at least partially correct the frequency discrepancy.

31 Claims, 5 Drawing Sheets

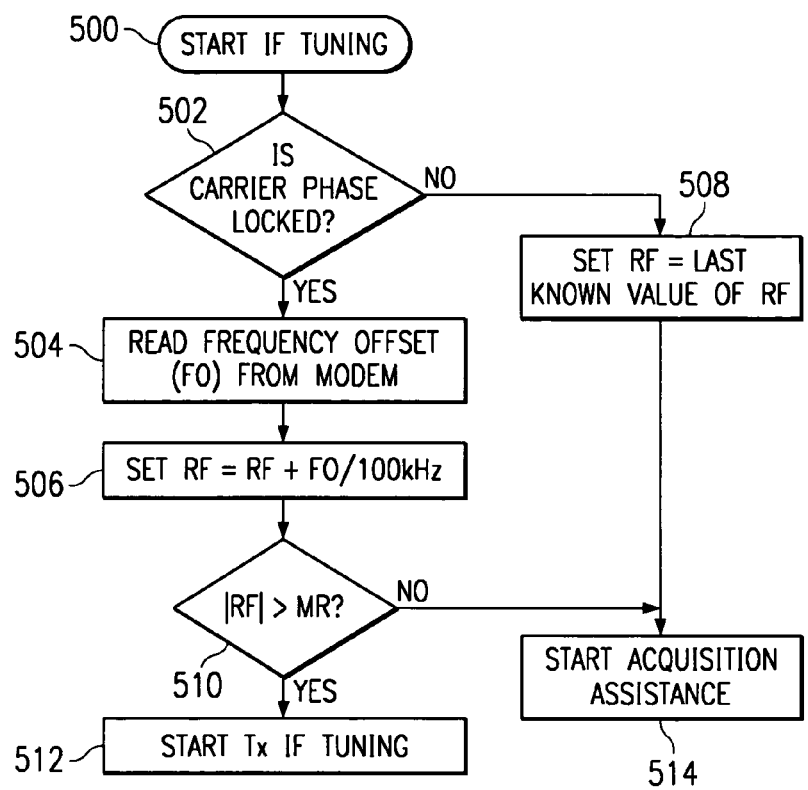
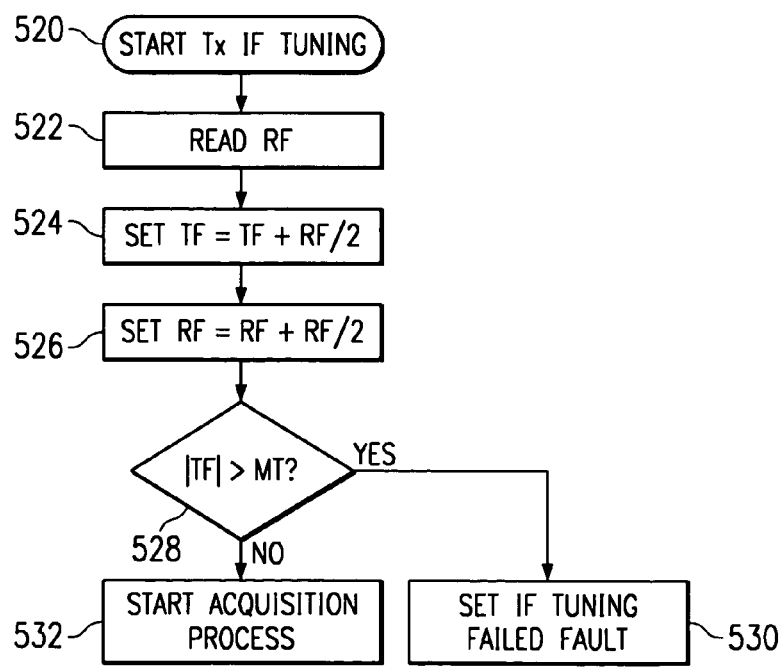

CARRIER FREQUENCY COMPENSATION SYSTEM AND METHOD

REFERENCE TO RELATED APPLICATIONS

Reference is made to the following and commonly assigned U.S. patent application entitled COMMERCIAL NETWORK BASED ON POINT TO POINT RADIOS, Ser. No. 09/245,701, filed Feb. 6, 1999, and which issued as U.S. Pat. No. 6,366,584 on Apr. 2, 2002, the disclosure of which is incorporated herein by reference.

TECHNICAL FIELD

The present invention relates generally to point-to-point microwave communication systems and, more particularly, to an apparatus and method for compensating for long-term frequency drift between radio sites.

BACKGROUND

Point-to-point microwave radio systems are widely used to transmit data between and among two nodes of a communication link. The microwave radio system includes microwave receivers and transmitters at both nodes of the system for transmitting and receiving data. Typically, data is received by a modem which modulates the data onto a baseband or intermediate frequency (IF) signal which is then up-converted to microwave frequencies, amplified and transmitted. The baseband or IF carrier is often provided by a phase-locked loop circuit which is locked to an IF oscillator or frequency synthesizer. In turn, the frequency synthesizer is often provided with a reference oscillator which is also used for the up-conversion of the modulated IF signal to the microwave frequencies.

The microwave signal is received at a remote terminal station through an appropriate microwave radio front end circuit. The receiving radio circuitry receives a locally generated reference signal from a reference oscillator to down-convert the microwave radio signal to a lower intermediate frequency or baseband signal to be demodulated so as to recover the digital data signal encoded onto the carrier signal. The demodulating modem uses a corresponding phase-locked loop circuit synchronized to the incoming baseband signal to recover the data. As in the transmitter circuit, the receiver's phase-locked loop circuit is similarly provided with an intermediate frequency signal from an IF oscillator or frequency synthesizer which is also locked to the reference oscillator.

Minor signal frequency variations between sites are accommodated by the tracking capability of the receiver's phase-locked loop circuitry. The phase-locked loop (PLL) circuit generally includes a phase detector receiving a reference signal together with a sample of the output of the phase-locked loop circuit. The output of the phase detector is provided to a loop filter which, in turn, provides an error signal controlling a voltage controlled oscillator (VCO). The VCO uses the error signal to maintain an output signal having a constant frequency defined by the feedback loop. This is accomplished by sampling the output signal provided by the VCO, dividing the frequency by a programmable counter, and then comparing the frequency divided sample with the reference signal input at the phase detector to provide the error signal.

While the PLL can accommodate and adjust to some frequency variation of the reference signal, its operating range is still limited by certain design criteria. Thus, the PLL must receive an input signal which is within a predetermined capture or pull in range of its free running frequency prior to "locking in," i.e., operating in a stable mode whereby the error signal provided by the phase detector and loop filter to the voltage control oscillator is within the range of the VCO's operating capability. Once locked, the frequency of the reference signal must be maintained within a hold-in range of frequencies in which the PLL will remain locked to the signal. This range is also known as the lock limit of the PLL. The limited frequency range of the PLL provides a corresponding lock range of the receiver station in which changes of the frequency of the received signal in comparison to the local reference clock frequency can be accommodated. If the difference between the local reference frequency and the received signal becomes too great, the PLL will unlock and the modem will be unable to detect the digital data signal contained in the modulated carrier signal.

Referring to FIG. 6, a radio communications terminal 100 transmits data over a microwave radio frequency link to radio communications terminal 200 which receives, detects and extracts the digital data for processing and/or retransmission to another site.

Communications terminal 100 receives digital data at modulator 112 of modem 110. Modulator 112 further receives an IF carrier signal from phase-locked loop 114 and superimposes thereon the digital data signal to provide a modulated carrier signal to radio circuitry 140. Radio circuitry 140 up-converts, i.e., translates the modulated baseband or IF signal output provided by modulator 112 of modem 110 to a microwave frequency, amplifies and transmits the signal to a receiving terminal. Phase-locked loop 114 of modem 110 receives, and is locked to, an IF frequency signal provided by frequency synthesizer 120 which, in turn, is locked to a reference frequency signal provided by reference oscillator 130.

Reference oscillator 130 also provides a signal to radio circuitry 140 to be used in up-converting the modulated IF signal to a microwave frequency signal, e.g., 38 GHz.

Communications terminal 200 includes radio circuitry 240 amplifying, filtering and down-converting the received microwave frequency signal received from transmitter terminal 100 to provide an IF or baseband output signal to demodulator 212 of modem 210. Demodulator 212 receives the IF or baseband signal and, using a local oscillator signal provided by phase-locked loop 214, recovers the digital signal and provides the same as an output signal corresponding to the input signal of communications terminal 100. Phase-locked loop 214 of modem 210 is locked to an IF signal provided by local oscillator or frequency synthesizer 220 which, in turn, is locked to an output provided by reference oscillator 230. As in the case of the transmitting terminal, reference oscillator 230 is used both for demodulation and for down-conversion between microwave and IF frequencies.

When initially deployed, reference oscillator 130 of transmitting terminal 100 and reference oscillator 230 of receiving terminal 200 are adjusted to provide reference signals having the same nominal frequency or corresponding frequencies. However, the frequencies of the reference oscillators tend to slowly drift over time due to various factors, including component aging. To the extent these oscillators drift at different rates and/or in different directions over time, the nominal frequency of the microwave signal transmitted and the nominal center frequency of the receiving terminal will increasingly differ over time. Within the hold-in range capability of the phase-locked loop in the receiver, such variations can be accommodated by the receiving modem 210. However, as the frequency drift between the terminals becomes more severe, the ability of the receiving PLL to retain a lock on the IF signal provided by radio circuitry 240 will be exceeded and the communications link will fail. It will then be necessary to manually adjust or replace the reference oscillators in the transmitting and receiver terminals 100 and 200, respectively, to bring the system back into frequency alignment. During this time, of course, the radio communications link is inoperative.

Accordingly, a need exists for a communications system which is immune to or can accommodate long term frequency drift of its internal frequency standard reference. A still further need exists for a modem which can retain a locked condition over a wide range of IF input signals without requiring an automatic frequency control circuit to have a disadvantageously wide capture, acquisition, or hold range capability. A still further need exists for a communications system which does not require expensive, highly stable reference frequency standards to operate properly and avoid loss of signal lock.

SUMMARY OF THE INVENTION

The present invention provides a communication modem, terminal and/or system which automatically compensates for long-term drift of the frequency standards or references used by the transmitting and receiver terminals so as to avoid manual adjustment of the terminals to bring them back within operating tolerances and minimize communications outages caused by the inability of the system to otherwise accommodate for such drift. The invention is usable over a broad range of media including the microwave region of the electromagnetic spectrum.

Briefly, the invention provides for automatic band selection to maintain a modulated carrier within the operating range of an automatic frequency control or tracking capability of a communication device such as a modem or other modulation device. This may be accomplished by selecting an appropriate reference signal used to control a center frequency of an automatic frequency control circuit (such as a phase-locked loop) or used to convert the carrier frequency of the modulated carrier to fall within the operating range of the automatic frequency control circuit and/or by causing the transmitting station to at least partially correct the frequency discrepancy.

According to one aspect of the invention, a communications terminal includes a modem receiving a modulated carrier signal. The modem preferably includes a carrier signal tracking circuit for continuously adjusting an actual center frequency of the modem about a nominal center frequency of the modem so as to cause the actual center frequency of the modem to correspond to a center frequency of the modulated carrier signal. The modem also preferably includes a controller which is responsive to the carrier signal tracking circuit for supplying a band select signal. A band selector is responsive to the band select signal for selecting one of a plurality of ranges of signal frequencies so as to cause the center frequency of the modulated carrier signal to be within one of the ranges including the nominal center frequency of the modem. According to a feature of the invention, the band selector provides a signal to the modem which defines the nominal center frequency of the modem. Alternatively, the band selector is operative to cause a frequency of the modulated carrier signal to be converted so as to provide the modulated carrier signal having the center frequency of the carrier signal.

According to another feature of the invention, the communications terminal preferably includes an interface to a remote transmitter terminal providing the modulated carrier signal. The communications terminal provides the remote transmitter terminal with a control signal over the interface to cause the remote transmitter terminal to change a frequency of the modulated carrier signal. According to a related feature of the invention, the communications terminal computes a frequency change value corresponding to a frequency change required to cause the modulated carrier signal to have a center frequency within a range of frequencies included in a median one of the plurality of ranges of signal frequencies. The communications terminal preferably causes the remote transmitter terminal to change the frequency of the modulated carrier signal by approximately one-half of the frequency change value computed. Thus, each terminal changes frequency by approximately one-half of the total change required to bring the frequencies back into alignment.

According to another feature of the invention, the controller of the communications terminal preferably causes a frequency reference signal to be generated corresponding to a selected one of the plurality of ranges of signal frequencies including the actual center frequency of the modulated carrier signal.

According to another aspect of the invention, a communications terminal preferably includes a converter receiving a microwave radio signal and, in response, provides an intermediate frequency signal. A frequency synthesizer is responsive to a tuning signal for providing a local oscillator signal. The communications terminal further includes a modem receiving the intermediate frequency signal, the modem including a demodulator and a phase-locked loop circuit. The demodulator recovers a digital signal from the intermediate frequency signal, while the phase-locked loop supplies a comparison signal in response to a comparison of a characteristic of the intermediate frequency signal and the local oscillator signal. A controller is responsive to the comparison signal to provide the tuning signal. The characteristic may be a phase relationship or a frequency of the signals. In the latter case, the comparison signal is representative of a frequency difference between the transmitter carrier and the receiver's center frequency defined by its phase-locked loop.

According to another feature of the invention, the tuning signal preferably varies the frequency of the local oscillator signal in a plurality of discrete steps on either side of a nominal center frequency value. The phase-locked loop may be configured to lock to the intermediate frequency signal over a range of signal frequencies which are on the same order of magnitude as a frequency range between ones of the discrete steps. That is, the hold-in or capture range of frequencies for the phase-locked loop is approximately equal to or slightly greater than the step size used to adjust the operating frequency of the phase-locked loop. The steps may be equally spaced, having a frequency difference between steps within a range of 50 to 200 KHz.

According to another feature of the invention, the communications terminal further preferably includes an alarm corresponding to a predetermined value of the comparison signal. The controller may be responsive to the alarm for adjusting the tuning signal.

According to another feature of the invention, the communications terminal preferably includes a communication interface to a transmitting terminal originating the radio frequency signal. The controller negotiates with the transmitting terminal on the interface to change the frequency of the radio frequency signal by an amount such as that equal to approximately one-half of a frequency change required to bring the frequency of the radio signal within capture range of the phase-locked loop.

According to another feature of the invention, the controller preferably provides the tuning signal so as to deterministically affect the comparison signal, e.g., minimize the value of the offset error signal. The phase-locked loop is operable over a predetermined range of signal frequencies on either side of a nominal center frequency while the controller calculates a number of discrete steps required to minimize the offset error signal.

According to another feature of the invention, the controller supplies the tuning signal to correspond to the number of discrete steps calculated. Alternatively, according to another feature of the invention, the controller supplies the tuning signal to correspond to a portion of the discrete steps calculated while communicating a remainder portion of the discrete steps calculated to a transmitter terminal originating the radio frequency signal.

According to another feature of the invention, the communications terminal further preferably includes a signal reacquisition routine which causes the frequency synthesizer to provide local oscillator signals having a predetermined sequence of frequencies. According to another feature of the invention, a reference frequency oscillator supplies a reference signal, whereby the converter additionally is responsive to the reference signal to provide the intermediate frequency signal. The frequency synthesizer is additionally responsive to the reference signal so as to provide the local oscillator signal.

According to another aspect of the invention, a communications terminal preferably includes a frequency synthesizer responsive to a tuning signal to provide a local oscillator signal. A modem includes a modulator which encodes a digital data signal onto the intermediate frequency signal as received. Also preferably included as part of the modem is a phase-locked loop circuit supplying an offset error signal in response to a difference between a frequency of the intermediate frequency signal and the frequency of the local oscillator signal. An up-converter receives the modulated intermediate frequency signal and, in response, provides a radio frequency signal. The communications terminal further includes a controller which is responsive to a frequency shift command signal from a remote terminal receiving the radio frequency signal to provide the tuning signal.

According to a feature of the invention, the terminal also preferably includes a reference frequency oscillator supplying a reference signal. The converter is responsive to the reference signal in addition to the intermediate frequency signal to provide the radio frequency signal. The frequency synthesizer is also responsive to the reference signal to provide the local oscillator signal.

According to another aspect of the invention, a preferred method of operating a communications terminal includes the steps of receiving a radio frequency signal, converting the radio frequency signal to an intermediate frequency signal, synthesizing a local oscillator signal in response to a tuning signal, comparing a frequency of the intermediate frequency signal and a frequency of a local oscillator signal to supply an offset error signal, providing the tuning signal in response to the offset error signal, and recovering a digital data signal from the intermediate frequency signal.

According to a feature of the method, the step of providing the tuning signal preferably varies the frequency of the local oscillator signal in a plurality of discrete steps on either side of a nominal center frequency value. The method may additionally include a step of providing an alarm corresponding to a predetermined value of the offset signal and, in response, providing a tuning signal.

According to another feature of the invention, the preferred method further includes a step of negotiating with a transmitting terminal to change a frequency of the radio frequency signal by an amount equal to approximately one-half of a frequency change required to bring the frequency of the radio frequency signal within a predetermined capture range.

According to another aspect of the invention, a communications system includes transmitter and receiver terminals. The transmitter terminal preferably includes a first frequency synthesizer responsive to a first timing signal to provide a first local oscillator signal. A first modem receives the first local oscillator signal and a data signal. The first modem preferably includes a first phase-locked loop circuit supplying a first carrier signal in response to the first local oscillator signal and a modulator encoding a digital data signal onto the first intermediate frequency signal. The transmitter terminal also preferably includes an up-converter receiving the modulated carrier signal and, in response, providing a radio frequency signal. A first controller is responsive to an externally applied frequency shift command signal to provide the first tuning signal. The receiver terminal preferably includes a down-converter receiving the microwave signal to provide a second modulated carrier signal. A second frequency synthesizer is responsive to a second tuning signal to provide a second local oscillator signal used in the demodulation process. In particular, a second modem receives the second intermediate frequency signal which is applied to a demodulator for recovering the digital data signal therefrom. A second phase-locked loop circuit is preferably included as part of the second modem to supply an offset error signal in response to a difference between a frequency of the second intermediate frequency signal and the frequency of the second local oscillator signal. Finally, a second controller is preferably responsive to the second offset error signal to supply the second tuning signal and the frequency shift command signal.

Although the present invention and its advantages have been described in detail, it should be understood that various changes, substitutions and alterations can be made herein without departing from the spirit and scope of the invention as defined by the appended claims. Moreover, the scope of the present application is not intended to be limited to the particular embodiments of the process, machine, manufacture, composition of matter, means, methods and steps described in the specification. As one of ordinary skill in the art will readily appreciate from the disclosure of the present invention, processes, machines, manufacture, compositions of matter, means, methods, or steps, presently existing or later to be developed that perform substantially the same function or achieve substantially the same result as the corresponding embodiments described herein may be utilized according to the present invention. Accordingly, the appended claims are intended to include within their scope such processes, machines, manufacture, compositions of matter, means, methods, or steps.

BRIEF DESCRIPTION OF THE DRAWING

FIG. 2 is a process flow diagram of a method for performing frequency compensation IF tuning;

FIG. 3 is a process flow diagram of a method for performing transmitter IF tuning;

DETAILED DESCRIPTION

Figure 1:
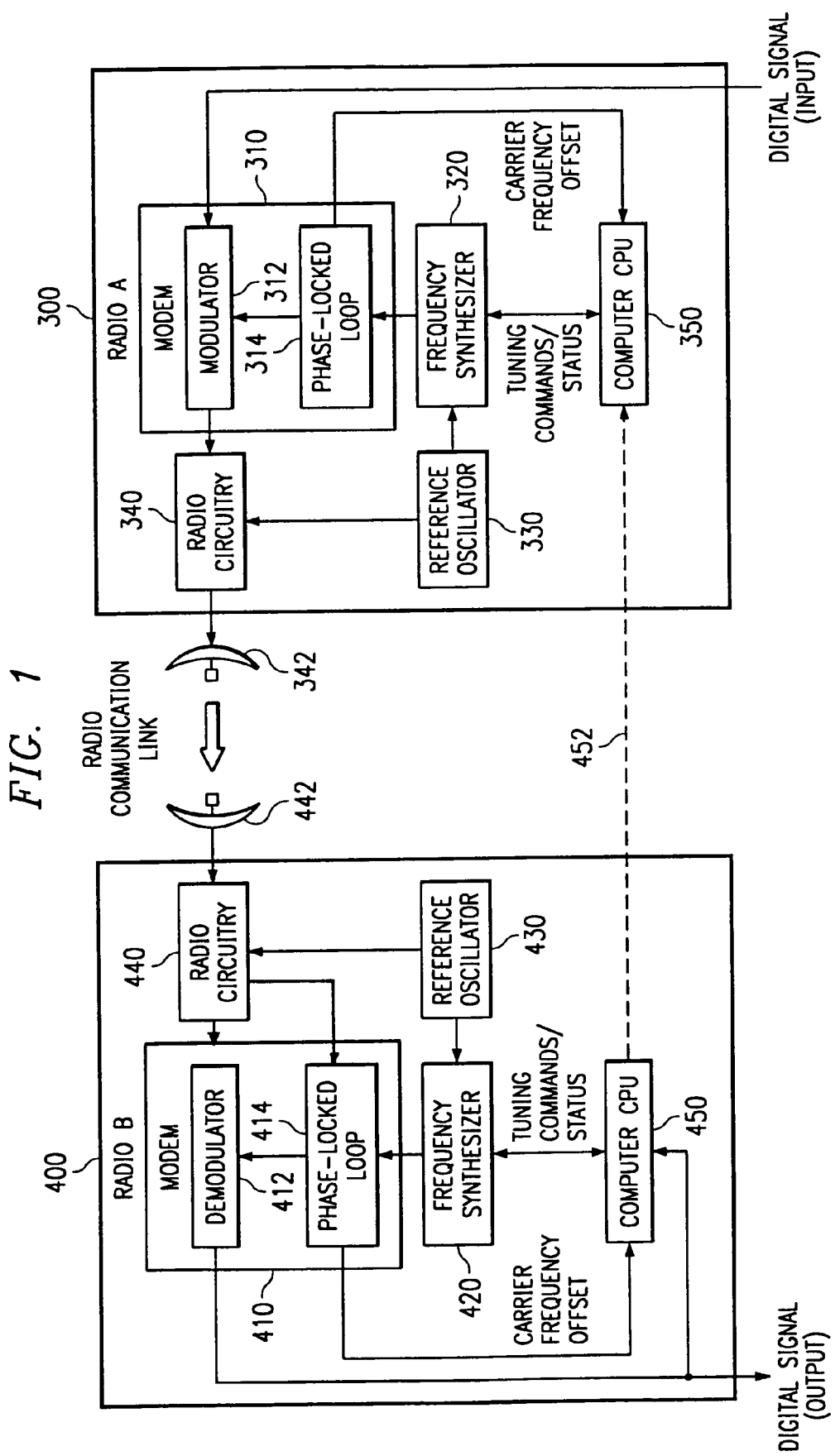
FIG. 1 is a block diagram of a point-to-point microwave radio communications system according to the invention.

FIG. 1 is a block diagram of a point-to-point microwave radio system according to a preferred embodiment of the invention for transmitting information in the form of a data signal from a transmitter site A to a receiver site B. Typically the data signal is in the form of a digital data stream. The system preferably works in the 38 GHz range but is equally applicable to other frequencies, modes, and media of data transmission wherein receiver and transmitter facilities use distinct clock or frequency references which may drift with respect to each other, degrading or entirely inhibiting link performance. For simplicity of explanation, the embodiment of FIG. 1 is shown as a unidirectional system for the transmission of data from transmitter site A to receiver site B, although, as will be detailed later, the invention is equally applicable to bidirectional, full duplex radio links and similar media having the aforementioned requirement to maintain a precise carrier frequency between and among transmitter and receiver stations.

Referring to FIG. 1, a microwave transmitter terminal 300 of the preferred embodiment includes a transmitter modem 310, frequency synthesizer 320, reference oscillator 330, radio transmitter 340 and computer CPU (central processing unit) 350. Transmitter modem 310 includes a modulator 312 and phase-locked loop 314. Computer CPU 350 is connected to frequency synthesizer 320 for providing tuning commands and for receiving status information to/from frequency synthesizer 320. A frequency or time standard in the form of reference oscillator 330 is connected to frequency synthesizer 320 and radio circuitry 340 to provide a reference signal of a predetermined frequency or clock rate. In turn, frequency synthesizer 320 is connected to phase-locked loop 314 of modem 310.

Frequency synthesizer 320 is tunable, preferably in discrete steps under the control of transmitter computer CPU 350, e.g., in 100 KHz increments on either side of a predetermined center frequency. For example, frequency synthesizer 320 may be programmable to generate frequencies over a range of plus and minus 500 KHz in 100 KHz steps, the resultant carrier signal being provided to PLL 314. PLL 314 in combination with modulator 312 receives the inputs from frequency synthesizer 320 and a digital data input signal to provide a modulated carrier signal to transmitter radio circuitry 340. Transmitter radio circuitry 340 up-converts and amplifies the modulated carrier signal to the desired transmission frequency range (e.g., 38 GHz). The amplified signal of this preferred embodiment is radiated by directional microwave transmitter antenna 342 toward microwave radio receiver site B.

Microwave receiver terminal 400 at receiver site B receives the microwave RF transmission from microwave transmitter terminal 300 at directional microwave receiver antenna 442. Conventionally, a preamplifier and an initial down-converter may be located at or be part of directional microwave receiver antenna 442. Such circuitry may include portions or all of microwave receiver terminal 400 which receives an output from antenna 442 at receiver radio circuitry 440. Using a master reference frequency signal from reference oscillator 430, radio circuitry provides an IF output to receiver modem 410. Reference oscillator 430 also provides a master reference or master frequency signal to frequency synthesizer 420 which is responsive to tuning commands from receiver computer CPU 450 for providing a signal having a frequency of the nominal IF frequency to PLL 414 of receiver modem 410. PLL 414 in combination with demodulator 412 receives the IF signal from radio circuitry 440 to recover a baseband or demodulated signal, separated from the IF carrier signal. The demodulated baseband signal is then provided as an output to other terminal equipment at the site (not shown) or for retransmission to a subsequent radio site, such as when deployed as part of a network as shown and described in the above referenced patent application entitled COMMERCIAL NETWORK BASED ON POINT TO POINT RADIOS PLL 414 also preferably provides a carrier frequency offset error signal to receiver computer CPU 450 indicative of the frequency difference between the incoming reference carrier signal provided by receiver radio circuitry 440 and a nominal center operating frequency of PLL as set by frequency synthesizer 420. Receiver computer CPU 450 is responsive to the error signal generated by PLL 414 to periodically change the frequency of the signal output by frequency synthesizer 420 to minimize the error signal received from PLL 414 and, thereby, recenter its nominal operating frequency or otherwise optimize operation of PLL 414 to compensate for drift in the carrier signal relative to reference oscillator 430.

PLLs 314 and 414 may be conventional phase-locked loops including, for example, a phase detector receiving an input signal such as from frequency synthesizer 420. Generally, phase detector also receives a portion of the signal output by the PLL which has been divided by a programmable counter. When the PLL is "locked," the sample has a frequency and phase which is the same as, or in a predetermined constant relationship with, the reference frequency signal. The phase detector provides an output signal to a loop filter corresponding to the phase difference between these two signals. The loop filter provides a control signal analogous to an error signal to a voltage controlled oscillator to provide an output signal having a desired frequency. Because the output signal is sampled and processed to have a frequency which is substantially the same as the reference signal, the PLL uses a feedback loop to lock the frequency and phase of the output signal to that of the input signal to the PLL. When used as part of a demodulator, the PLL acts as a low pass filter to recover a baseband signal from a modulated carrier signal. Similarly, the PLL provides the appropriate IF frequency in a radio transmitter modem for modulation and subsequent up-conversion and transmission by the transmitter station.

In addition to providing an output for controlling frequency synthesizer 420, receiver computer CPU 450 also preferably provides control signaling to transmitter computer CPU 350 over communications link 452. Communications link 452 may be a dedicated network maintenance channel, a discrete RF back or control channel, or an overhead channel used by and/or available to the system as are described in the above referenced patent application entitled COMMERCIAL NETWORK BASED ON POINT TO POINT RADIOS. Using this link, receiver computer CPU 450, preferably in cooperation with compute CPU 350, can control both frequency synthesizers 320 and 420 to bring microwave transmitter terminal 300 and microwave receiver terminal 400 back into frequency alignment and, particularly, within the capture and frequency hold ranges of phase-locked loop 414 to maintain reception and demodulation of the digital data signals transported over the link. In a preferred embodiment, receiver computer CPU 450 monitors the carrier frequency offset from PLL 414 to periodically or continuously select an appropriate offset frequency for frequency synthesizer 420. Alternatively, CPU 450 may await making adjustments to the output from synthesizer 420 until a predetermined maintenance period or in response to certain other network conditions. For example, CPU 450 may defer frequency adjustments until a period of low network use to avoid losing the communications link and creating a network outage which may result from reprogramming synthesizer 420.

Upon frequency synthesizer 420 reaching or approaching a maximum offset signal, or other predetermined threshold condition, or receiver computer CPU 450 requiring an offset amount greater than achievable by frequency synthesizer 420 alone, receiver computer CPU 450, preferably negotiates with transmitter computer CPU 350 to accomplish a desired adjustment. As a result, microwave transmitter terminal 300 and microwave receiver terminal 400 may each change frequency by approximately one-half of the total required to minimize the magnitude of frequency offset experienced and compensated by PLL 414.

Receiver modem 410 provides computer CPU 450 with the following variables in a most preferred embodiment to implement the frequency compensation method according to the invention, including:

1. Carrier frequency offset (FO): A signed scalar quantity indicating the frequency difference between the IF signal of the transmitter and that of the receiver.
2. Transmitter IF frequency (TF): The frequency of the baseband IF signal output by PLL 314 at the transmitter site A.
3. Receiver IF frequency (RF): The frequency of the signal provided by PLL 414 to demodulator 412.
4. Maximum transmitter IF frequency (MT): The maximum frequency offset effect from a predetermined nominal operating frequency achievable by corresponding changes to the output of frequency synthesizer 320 of microwave transmitter terminal 300.
5. Maximum receiver IF frequency (MR): The maximum offset frequency from a PLL nominal center frequency achievable by programming frequency synthesizer 420.
6. Carrier phase-locked indication (FLAG): A binary indicator of the locked/unlocked condition of PLL 414.

A portion of the processing performed to accomplish the frequency compensation method according to a preferred embodiment of the invention is shown in FIG. 2. This process can be performed continuously, initiated in response to a maintenance feature, performed automatically when a predetermined high carrier frequency offset value is determined, performed at predetermined intervals, or the like. For example, receiver CPU 450 may initiate the frequency compensation procedure when the modem carrier offset exceeds 75% of the PLL lock range as indicated by a carrier frequency offset output FO from the modem. Alternatively, the procedure may be delayed until authorization is received from a network manager system so that any possible outage caused by the frequency compensation procedure, although unlikely depending on the speed of the circuitry instigating the change and that locking on the signal and, if occurring, only likely to be very brief, will be scheduled to minimize impact on network availability. Thus, the frequency compensation may be scheduled for a time period when network usage is minimal, non-critical, or backup systems are available and are operating to compensate for any system outage or interruption during the frequency compensation procedure. Upon initiation of the procedure of FIG. 2 at entry point 500, flow continues to determine if the IF carrier signal received by modem 410 is phase-locked by PLL 414. If PLL 414 is unlocked, then the variable RF frequency is set to the last known value and processing continues at step 514 to initiate reacquisition of the carrier and associated IF signals.

If PLL 414 is operating in a locked mode, i.e., the IF frequency received from radio circuitry 440 is within the hold-in range of PLL 414 so that the output signal provided by PLL 414 is locked to the signal provided by frequency synthesizer 420, the process continues at step 504 where the carrier frequency offset value FO is obtained from receiver modem 410. The carrier frequency offset FO represents the frequency difference between the receiver and transmitter input and output signals or the difference between their respective IF frequencies.

As previously discussed, prior art modems require that the receiver modem PLL be the sole resource for automatically compensating for deviation between transmitter and receiver frequencies. In contrast the invention (as shown at process 506) computes a new receiver IF frequency RF as being equal to the nominal receiver center frequency plus the carrier frequency offset FO rounded or truncated to the nearest 100 KHz (i.e., the step size used by frequency synthesizer 420 to adjust its output on either side of the nominal center frequency.) For example, according to one embodiment, PLL 414 may be controlled to achieve a maximum obtainable IF synthesizer frequency offset of plus or minus 500 KHz in 100 KHz increment steps by corresponding stepped changes to the output of frequency synthesizer 420 on either side of its nominal center frequency. Thus, the receiver IF frequency required to minimize PLL 414 offset is computed at step 506 and, at step 510, is compared with the maximum receiver IF frequency shift obtainable using frequency synthesizer 420. If the proposed offset falls within the capability of frequency synthesizer 420 (i.e., the absolute value of the computed radio IF frequency is less than or equal to the maximum receiver IF frequency MR), the processing continues at the start acquisition assistance flow diagram of FIG. 4. Alternatively, if RF is greater than MR, then processing continues at step 512 which is expanded in the flow diagram of FIG. 3. Thus, if the required frequency change falls outside the receiver's capabilities or desired operating range, then microwave receiver terminal 400 will, according to a preferred embodiment of the invention, negotiate with microwave transmitter terminal 300 to split the required offset by varying both the transmitter and receiver IF frequencies toward each other to minimize carrier frequency offset FO.

Of course, other divisions of the desired offset may be employed, if desired. For example, as a preferred embodiment utilizes a maximum amount of available adjustment at a receiver location before exploiting communication resources and transmitter adjustment resources to distribute the desired offset, or alternative embodiment may operate to initially provide all or most offset at a transmitter location to lengthen the interval until a next such negotiation occurs. Moreover, such negotiations may consider information in addition to an amount of offset desired. For example, historical information, such as a direction of drift (i.e., increase or decrease in frequencies) of either or both ends of the link, a speed or rate at which drift has been experienced, or the like may be considered in order to better delegate the desired offset, such as to minimize a number of such further negotiations, etc.

A flow chart of a preferred embodiment of the IF tuning method coordinating adjustment of the transmitter frequency is shown in FIG. 3. If the IF synthesizer in the receiver has exceeded its tuning capability, the required frequency compensation may be achieved by tuning the IF synthesizer in the transmitter in conjunction with the IF synthesizer 10 in the receiver. If the required IF tuning cannot be accommodated by a proper adjustment of both the transmit and receive IF synthesizers, a fault is preferably indicated.

In particular, adjustment of the transmitter IF frequency is initiated at step 520, the previously computed receiver IF frequency RF being read at step 522 and the corresponding transmitter frequency representing half of the required frequency shift is computed at step 524. That is, the transmitter IF frequency is determined to be its nominal transmitter IF frequency TF minus one-half of the receiver IF frequency previously computed. The remainder of the frequency adjustment required is computed at step 526 by setting the receiver IF frequency equal to its nominal value plus one-half of the computed value. A check is performed at step 528 to determine if the computed transmitter IF frequency is within the maximum transmitter IF frequency for the system. If the computed transmitter IF frequency falls outside of this range so that frequency synthesizer 320 cannot accommodate the frequency adjustment, then an error message is generated at step 530. Otherwise, processing continues with the start acquisition process at step 532 as will be more fully explained with reference to FIG. 4.

Figure 4:
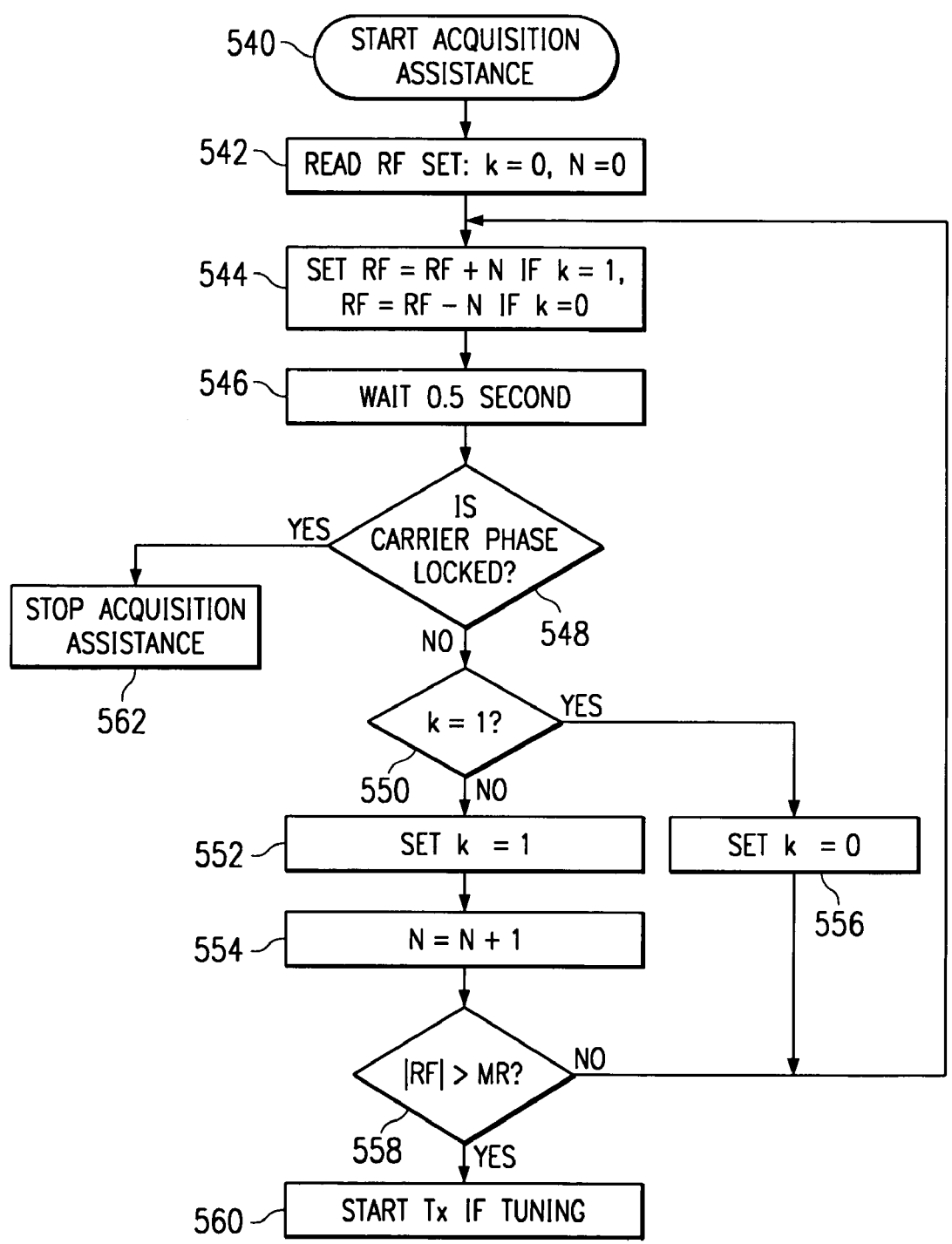
FIG. 4 is a process flow diagram of a method for assisting signal acquisition.

FIG. 4 is a flow chart of the acquisition assist process of a preferred embodiment of the present invention. When acquisition assistance is initiated, receiver modem 410 begins by trying for a predetermined time, such as up to 0.5 seconds, to lock to the received carrier. If signal lock is not achieved, the receive modem attempts to lock by repeatedly tuning the IF frequency synthesizer 420 further and further from the current center frequency until lock is attained, the acquisition assist process times out, or no lock is attained and further IF frequency tuning is not possible. If a lock is achieved, the link will return to service. If a lock is not achieved, the process continues to attempt a lock, but a critical alarm due to a link out of service condition will persist until lock-up is achieved. Such an alarm may operate to cause synthesizer 320 to also begin tuning to various IF frequencies in order to assist modem 410 in locking to the received carrier.

Referring to FIG. 4, the start acquisition assistance process is entered at step 540 and the variables used to step through the process are initialized at step 542. In particular, the receiver IF frequency is set as previously computed by the frequency compensation IF tuning process of FIG. 2 or the receiver and transmitter IF tuning process of FIG. 3. Loop variables k and N are set, k being a binary value indicating the direction of each progressive offset and N indicating the magnitude of each offset from the value RF previously computed.

Step 544 is the top of a "while" loop ending with carrier lock at decision box 548. The while loop is entered at step 544 where the appropriate step value is added to or subtracted from the receiver IF frequency depending on the current value for k. Initially, upon loop entry, N=0 and k=0 so that there is no change to the receiver IF frequency RF. The process then preferably waits for 0.5 seconds at step 546 to provide time for PLL 414 to capture the signal and lock to it. If lock is achieved, then the while loop is exited and the process terminates at step 562. If, however, PLL 414 is unable to lock to the IF frequency, then the process sequentially steps the value of RF in increasing magnitudes on both sides of the center frequency RF until frequency lock is attained or the combined capability of the transmitter modem and receiver modem to converge is exceeded. Thus, at step 550, if k=1 (indicating that the current offset had already been used to increment the value of RF), then k is reset to be equal to zero at step 556 so that the value of N is used to decrement the value of RF the next time through process step 544. Alternatively, if k is not equal to one, i.e., k=0, then processing continues out of the top of decision step 550 to set k equal to one at step 552 and to increment N at 554. A check is then performed at decision step 558 to determine if the value of RF when incremented by the current value of N would exceed the maximum receiver IF frequency MR. If the value of RF when incremented by N falls within the capability of the receiver, i.e., is less than or equal to the maximum receiver IF frequency, then processing continues at process step 544 to attempt a lock. Otherwise, processing continues out of the top of decision step 558 to initiate transmitter IF tuning to attempt to converge the transmitter frequency to the receiver frequency as previously described in connection with FIG. 3. As previously explained, the transmitter IF tuning process preferably has receiver CPU 450 instruct transmitter CPU 350 to adjust the frequency of frequency synthesizer 320 to shift frequency one-half of the total required to bring transmitter modem 310 and receiver modem 410 into frequency alignment to a degree whereby PLL 414 can achieve a locked condition at step 548.

Figure 5:
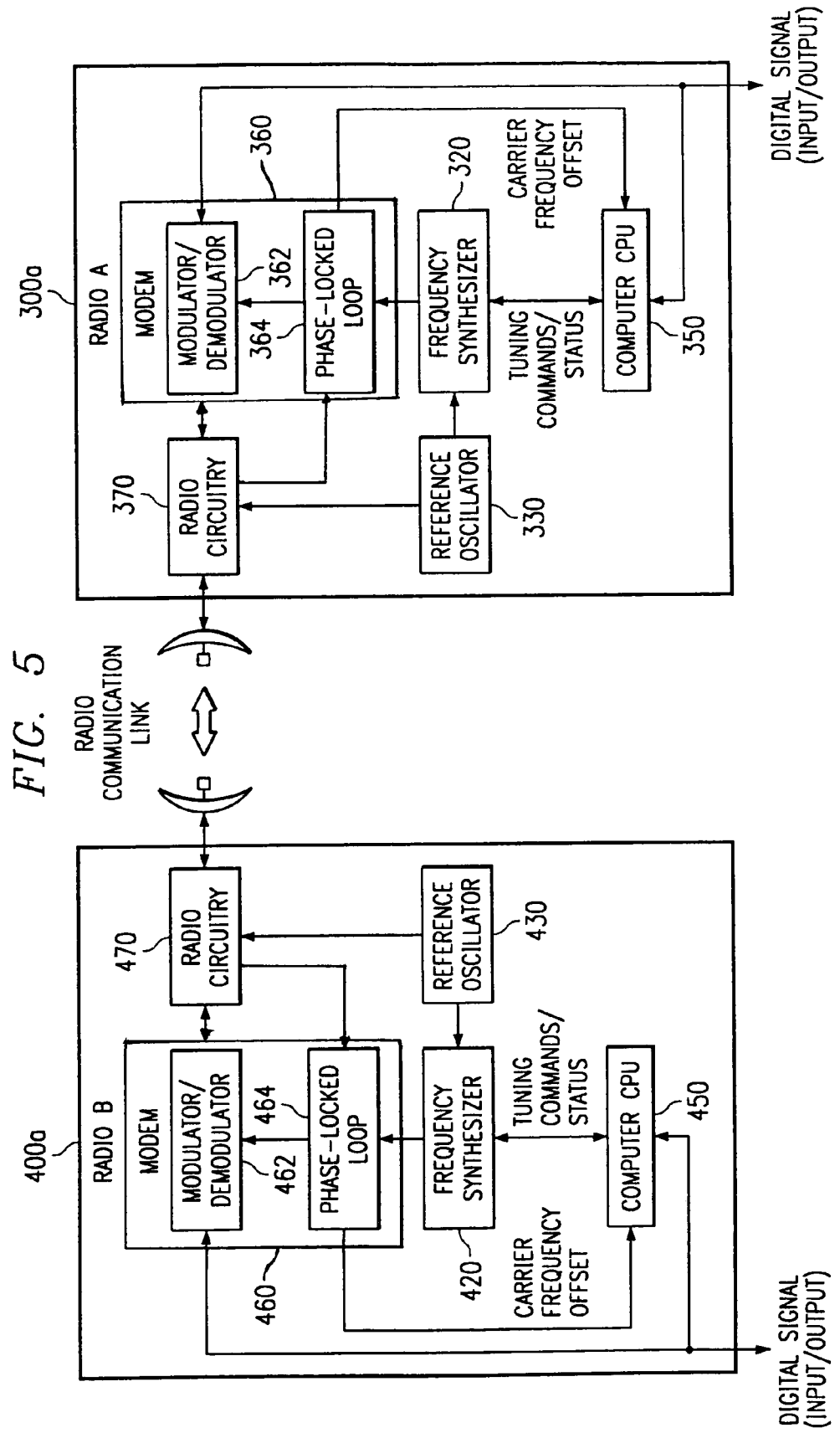
FIG. 5 is a block diagram of a bidirectional point-to-point microwave link according to the invention.
Figure 6:
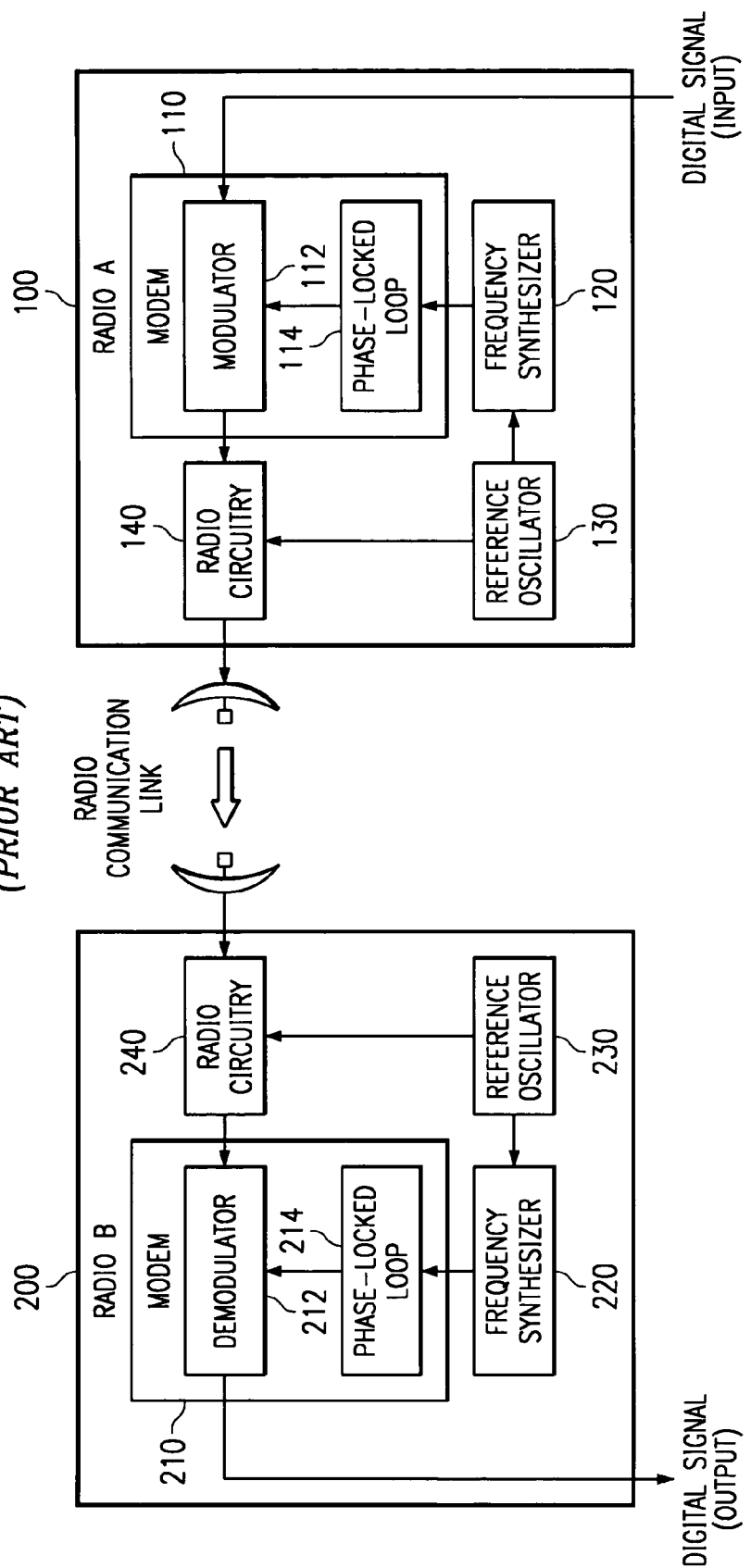
FIG. 6 is a block diagram of a point-to-point microwave system according to the prior art.

FIG. 5 depicts a bidirectional embodiment of the invention wherein microwave sites 300a and 400a each include receiver and transmitter capabilities and an existing site-to-site overhead channel may be used to coordinate automatic alignment of the systems to maintain or reacquire lock by PLLs 364 and 464. In this configuration, one of the sites may be designated as a master and the other a slave. For example, even though microwave radio facility 400a has both receive and transmitter capabilities, it would perform the frequency compensation process earlier detailed for the receiver terminal whereas facility 300a would perform those functions detailed in connection with the microwave transmitter terminal. Alternatively, each radio site might perform processing to maintain lock on its receive signal independently of the far transmitter station in each case.

Although several embodiments of the invention have been described in detail above, it should be clear that the present invention is capable of numerous modifications as would be apparent to one of ordinary skill in the art. Such modifications fall within the purview of the appended claims. For example, the invention is equally applicable to point-to-multipoint radio systems in general and to other media of communication wherein gross frequency alignment between a transmitter and one or more receivers is achieved using one capability such as the programmable frequency synthesizer described in the embodiments above, and real time fine alignment is achieved by alternate means such as the PLLs according to those embodiments. Thus, the invention is applicable to all such tunable communications devices including, for example, an automatic frequency control system of limited range augmented by a gross frequency adjustment facility such that frequency alignment between terminals is maintained and, as necessary, reachieved. Moreover, there is no limitation of the present invention to its use with wireless or even radio frequency communications. For example, the concepts of the present invention are applicable to wired communication systems utilizing modulated signals. Additionally, electro magnetic modulation of signals is not required for the advantages of the present invention to be realized, as these concepts are applicable to other modulation techniques, such as light or optic transmission of data.

Although the present invention and its advantages have been described in detail, it should be understood that various changes, substitutions and alterations can be made herein without departing from the spirit and scope of the invention as defined by the appended claims. Moreover, the scope of the present application is not intended to be limited to the particular embodiments of the process, machine, manufacture, composition of matter, means, methods and steps described in the specification. As one of ordinary skill in the art will readily appreciate from the disclosure of the present invention, processes, machines, manufacture, compositions of matter, means, methods, or steps, presently existing or later to be developed that perform substantially the same function or achieve substantially the same result as the corresponding embodiments described herein may be utilized according to the present invention. Accordingly, the appended claims are intended to include within their scope such processes, machines, manufacture, compositions of matter, means, methods, or steps.

What is claimed is:

1. A radio communications terminal comprising:
   a converter receiving a radio frequency signal and, in response, providing an intermediate frequency signal;
   a frequency synthesizer responsive to a tuning signal for providing a frequency synthesized local oscillator signal;
   a radio modem receiving said intermediate frequency signal and including
      (i) a demodulator recovering a digital data signal from said intermediate frequency signal, and
      (ii) a phase-locked loop comparing a characteristic of said frequency synthesized local oscillator signal and intermediate frequency signals and, in response, providing a comparison signal; and
   a controller responsive to said comparison signal for providing said tuning signal.

2. The radio communications terminal according to claim 1 wherein said characteristic is a phase relationship.

3. The radio communications terminal according to claim 1 wherein said characteristic is frequency.

4. The radio communication terminal according to claim 1 wherein said tuning signal varies said frequency of said frequency synthesized local oscillator signal in a plurality of discrete steps on either side of a nominal center frequency value.

5. The radio communication terminal according to claim 4 wherein said phase-locked loop is configured to lock to said intermediate frequency signal over a range of signal frequencies which is on the same order of magnitude as a frequency range between ones of the discrete steps.

6. The radio communication terminal according to claim 4 wherein the discrete steps are equally spaced, having a frequency difference between steps within a range of 50 to 200 kilohertz.

7. The radio communication terminal according to claim 1 further including an alarm corresponding to a predetermined value of said comparison signal.

8. The radio communication terminal according to claim 7 wherein said controller is responsive to said alarm for adjusting said tuning signal.

9. The radio communication terminal according to claim 1 further including a communication interface to a transmitting terminal originating said radio frequency signal, said controller negotiating with said transmitting terminal on said interface to change a frequency of said radio frequency signal by an amount equal to approximately one-half of a frequency change required to bring a frequency of said intermediate frequency signal within a capture range of said phase-locked loop.

10. The radio communication terminal according to claim 1 wherein said controller provides said tuning signal so as to produce a desired effect on said comparison signal.

11. The radio communication terminal according to claim 10 wherein said phase-locked loop is operable over a predetermined range of signal frequencies on either side of a nominal center frequency and said controller calculates a number of the discrete steps required so as to produce a desired effect on said comparison signal.

12. The radio communication terminal according to claim 11 wherein said controller supplies said tuning signal to correspond to said number of the discrete steps calculated.

13. The radio communication terminal according to claim 11 wherein said controller supplies said tuning signal to correspond to a portion of the discrete steps calculated and communicates a remaining portion of the discrete steps calculated to a transmitter terminal originating said radio frequency signal.

14. The radio communications terminal according to claim 1 wherein said controller includes a signal reacquisition routine causing said frequency synthesizer to provide frequency synthesized local oscillator signals having a predetermined sequence of frequencies.

15. The radio communications terminal according to claim 1 further comprising a reference frequency oscillator supplying a reference signal, said converter additionally responsive to said reference signal for providing said intermediate frequency signal and said frequency synthesizer additionally responsive to said reference signal for providing said frequency synthesized local oscillator signal.

16. A radio communications terminal comprising:
   a frequency synthesizer responsive to a tuning signal for providing a frequency synthesized local oscillator signal;
   a radio modem receiving said frequency synthesized local oscillator signal and including
      (i) a phase-locked loop circuit receiving said frequency synthesized local oscillator signal and, in response, providing a carrier signal, and
      (ii) a modulator encoding a data signal onto said carrier signal to provide a modulated carrier signal;
   a converter receiving said modulated carrier signal and, in response, providing a radio frequency signal; and
   a controller responsive to a frequency shift command signal from a remote terminal receiving said radio frequency signal for providing said tuning signal.

17. The radio communications terminal according to claim 16 further comprising a reference frequency oscillator supplying a reference signal, said converter additionally responsive to said reference signal for providing said radio frequency signal and said frequency synthesizer additionally responsive to said reference signal for providing said frequency synthesized local oscillator signal.

18. The radio communication terminal according to claim 16 wherein said tuning signal varies the frequency of said frequency synthesized local oscillator signal in a plurality of discrete steps on either side of a nominal center frequency value.

19. The radio communication terminal according to claim 18 wherein said phase-locked loop is configured to lock to said intermediate frequency signal over a range of signal frequencies which is on the same order of magnitude as a frequency range between ones of the discrete steps.

20. The radio communication terminal according to claim 18 wherein the discrete steps are equally spaced, having a frequency difference between steps within a range of 50 to 200 kilohertz.

21. The radio communication terminal according to claim 16 wherein said phase-locked loop additionally provides an error signal, said controller responsive to said error signal for adjusting said tuning signal.

22. A method of operating a radio communications terminal comprising the steps of:
 receiving a radio frequency signal;
 converting said radio frequency signal to an intermediate frequency signal;
 synthesizing a frequency synthesized local oscillator signal in response to a tuning signal;
 comparing a frequency of said intermediate frequency signal and a frequency of said frequency synthesized local oscillator signal to supply an offset error signal;
 providing said tuning signal in response to said offset error signal; and
 recovering a digital data signal from said intermediate frequency signal.

23. The method according to claim 22 wherein said step of providing said tuning signal varies the frequency of said frequency synthesized local oscillator signal in a plurality of discrete steps on either side of a nominal center frequency value.

24. The method according to claim 22 further including a step of providing an alarm corresponding to a predetermined value of said offset error signal.

25. The method according to claim 24 wherein said step of providing said tuning signal is performed in response to said alarm for adjusting said tuning signal.

26. The method according to claim 22 further comprising the step of negotiating with a transmitting terminal to change a frequency of said radio frequency signal by an amount equal to approximately one-half of a frequency change required to bring said frequency of said intermediate frequency signal within a predetermined capture range.

27. A radio communications system comprising:
 (a) a transmitter terminal including
  (i) a first frequency synthesizer responsive to a first tuning signal for providing a first frequency synthesized local oscillator signal;
  (ii) a first radio modem receiving said first frequency synthesized local oscillator signal and including
   a first phase-locked loop circuit supplying a carrier signal and in response to said first frequency synthesized local oscillator signal, and
   a modulator encoding a data signal onto said carrier signal to supply a first modulated carrier signal;
  (iii) an up-converter receiving said first modulated carrier signal and, in response, providing a radio frequency signal; and
  (iv) a first controller responsive to a frequency shift command signal for providing said first tuning signal; and
 (b) a receiver terminal including
  (i) a down-converter receiving said radio frequency signal and, in response, providing a second modulated carrier signal;
  (ii) a second frequency synthesizer responsive to a second tuning signal for providing a second frequency synthesized local oscillator signal;
  (iii) a second radio modem receiving said modulated carrier signal and including
   a second phase-locked loop circuit responsive to said second frequency synthesized local oscillator signal to supply (a) an intermediate frequency signal and (b) an offset error signal in response to a difference between a frequency of said second modulated carrier signal and a frequency of said second intermediate frequency signal, and
   a demodulator recovering said data signal from said second modulated carrier signal; and
  (iv) a second controller responsive to said offset error signal for providing said second tuning signal and said frequency shift command signal.

28. The radio communication system according to claim 27 wherein said first and second tuning signals vary respective ones of said frequencies of said first and second frequency synthesized local oscillator signals in a plurality of discrete steps on either side of respective nominal center frequency values.

29. The radio communication system according to claim 27 further including an alarm corresponding to a predetermined value of said offset error signal.

30. The radio communication system according to claim 29 wherein said second controller is responsive to said alarm for adjusting said second tuning signal and for providing said frequency shift command signal.

31. The radio communication system according to claim 27 wherein said second controller negotiates with said first controller to change a frequency of said radio frequency signal by an amount equal to approximately one-half of a frequency change required to bring said frequency of said second modulated carrier signal within a capture range of said second phase-locked loop.

* * * * *